(12) United States Patent
Cooper et al.

(10) Patent No.: US 8,993,221 B2
(45) Date of Patent: Mar. 31, 2015

(54) BLOCK CO-POLYMER PHOTORESIST

(71) Applicant: Pixelligent Technologies, LLC, Baltimore, MD (US)

(72) Inventors: Gregory D. Cooper, Fulton, MD (US); Brian L. Wehrenberg, Baltimore, MD (US)

(73) Assignee: Pixelligent Technologies, LLC, Baltimore, MD (US)

( * ) Notice: Subject to any disclaimer, the term of this patent is extended or adjusted under 35 U.S.C. 154(b) by 0 days.

(21) Appl. No.: 13/764,514

(22) Filed: Feb. 11, 2013

(65) Prior Publication Data

US 2013/0207238 A1      Aug. 15, 2013

Related U.S. Application Data

(60) Provisional application No. 61/597,526, filed on Feb. 10, 2012, provisional application No. 61/597,544, filed on Feb. 10, 2012.

(51) Int. Cl.
| | |
|---|---|
| *G03F 7/26* | (2006.01) |
| *G03F 7/004* | (2006.01) |
| *G03F 7/20* | (2006.01) |
| *H01L 29/06* | (2006.01) |
| *G03F 7/00* | (2006.01) |

(Continued)

(52) U.S. Cl.
CPC ........ *G03F 7/004* (2013.01); *G03F 7/20* (2013.01); *H01L 29/06* (2013.01); *G03F 7/0002* (2013.01); *G03F 7/039* (2013.01); *H01L 21/0271* (2013.01); *B81C 1/00031* (2013.01); *B82Y 10/00* (2013.01); *B82Y 40/00* (2013.01); *B81C 2201/0149* (2013.01)

USPC .......... 430/322; 430/311; 430/328; 430/330; 430/313

(58) Field of Classification Search
USPC .................. 430/311, 313, 322, 328, 330
See application file for complete search history.

(56) References Cited

U.S. PATENT DOCUMENTS

| | | | |
|---|---|---|---|
| 4,253,728 A | 3/1981 | Venkatesan et al. | |
| 4,698,238 A | 10/1987 | Hayasaka et al. | |

(Continued)

FOREIGN PATENT DOCUMENTS

| | | |
|---|---|---|
| CN | 1303358A A | 7/2001 |
| EP | 0023231 A | 2/1981 |

(Continued)

OTHER PUBLICATIONS

Belfield et al., "Multiphoton-absorbing organic materials for microfabrication, emerging optical applications and non-destructive three-dimensional imaging," J. Phys. Org. Chem. 13, p. 837-849 (2000).

(Continued)

*Primary Examiner* — Caleen Sullivan
(74) *Attorney, Agent, or Firm* — Nixon & Vanderhye P.C.

(57) ABSTRACT

An integrated circuit is made by depositing a pinning layer on a substrate. A block copolymer photoresist is formed on the pinning layer. The block copolymer has two blocks A and B that do not self-assemble under at least some annealing conditions. The exposed block copolymer photoresist is processed to cleave at least some block copolymer bonds in the exposed selected regions. The exposed pinning layer is processed to create a chemical epitaxial pattern to direct the local self assembly of the block copolymer.

13 Claims, 5 Drawing Sheets

A.  Self assembled block copolymer film on substrate

B.  Selective exposure to actinic radiation

C.  After BCP development

D.  After subsequent etching and removal of resist (51) Int. Cl.
  G03F 7/039 (2006.01)
  H01L 21/027 (2006.01)
  B81C 1/00 (2006.01)
  B82Y 10/00 (2011.01)
  B82Y 40/00 (2011.01)

(56) References Cited

U.S. PATENT DOCUMENTS

| | | |
|---|---|---|
| 5,121,256 A | 6/1992 | Corle et al. |
| 5,187,715 A | 2/1993 | Weisbuch et al. |
| 5,281,840 A | 1/1994 | Sarma |
| 5,739,898 A | 4/1998 | Ozawa et al. |
| 6,005,707 A | 12/1999 | Berggren et al. |
| 6,291,110 B1 | 9/2001 | Cooper et al. |
| 6,291,145 B1 | 9/2001 | Kokubo et al. |
| 6,440,637 B1 | 8/2002 | Choi et al. |
| 6,455,103 B1 | 9/2002 | Mennig et al. |
| 6,806,026 B2 | 10/2004 | Allen et al. |
| 6,819,845 B2 | 11/2004 | Lee et al. |
| 6,826,144 B1 | 11/2004 | Ichihara et al. |
| 6,927,002 B2 | 8/2005 | Hattori et al. |
| 7,524,616 B2 | 4/2009 | Chen et al. |
| 2002/0027647 A1 | 3/2002 | Cooper et al. |
| 2002/0182541 A1 | 12/2002 | Gonsalves |
| 2002/0185634 A1 | 12/2002 | Marder et al. |
| 2003/0047816 A1 | 3/2003 | Dutta |
| 2003/0064532 A1 | 4/2003 | Chen |
| 2003/0071983 A1 | 4/2003 | Hung et al. |
| 2003/0099897 A1 | 5/2003 | Fedynyshyn |
| 2003/0117598 A1 | 6/2003 | Case et al. |
| 2003/0119962 A1 | 6/2003 | Border et al. |
| 2003/0128347 A1 | 7/2003 | Case et al. |
| 2003/0129545 A1 | 7/2003 | Kik et al. |
| 2003/0227249 A1 | 12/2003 | Mueller et al. |
| 2004/0075895 A1 | 4/2004 | Lin |
| 2004/0152011 A1 | 8/2004 | Chen et al. |
| 2005/0147920 A1 | 7/2005 | Lin et al. |
| 2005/0156147 A1 | 7/2005 | Akiba et al. |
| 2005/0173682 A1 | 8/2005 | Zhang et al. |
| 2005/0254035 A1 | 11/2005 | Frankel |
| 2006/0028634 A1 | 2/2006 | Tuberfield et al. |
| 2006/0098181 A1 | 5/2006 | Case et al. |
| 2007/0258071 A1 | 11/2007 | Case et al. |
| 2010/0092873 A1* | 4/2010 | Sills et al. ............ 430/5 |

FOREIGN PATENT DOCUMENTS

| | | |
|---|---|---|
| JP | 6-291009 | 10/1994 |
| JP | 7-220990 | 8/1995 |
| JP | 2001-057329 A | 2/2001 |
| RU | 2051940 C1 | 1/1996 |
| SU | 948994 A1 | 8/1982 |
| SU | 1204623 A1 | 1/1986 |
| WO | 93/25611 A | 12/1993 |
| WO | 00/04593 A | 1/2000 |
| WO | 00/06495 A | 2/2000 |
| WO | 03/009058 A2 | 1/2003 |
| WO | 2005/029180 A2 | 3/2005 |

OTHER PUBLICATIONS

Brus, L.E,. J. Chem. Phys., 79(11), "A simple model for the ionization potential, electron affinity, and aqueous redox potentials of small semiconductor crystallites," 5566-71 (Dec. 1, 1983).
Efros, Al.L et al., "Interband absorption of light in a semiconductor sphere," Sov. Phys. Semicon.,16:772-78 (Jul. 1982).
Empedocles, S.A. et al., "Quantum-Confined Stark Effect in Single CdSe Nanocrystallite Quantrun Dots," Science, 278, 2114 (Dec. 19, 1997).
Gribkovskii , P., V.A. Zyulkov, A.E. Kazachenko, and S.A. Tikhomirov, "Optical/Nnonlinearity of Semiconductor Microcrystal CdS.sub.xSe.sub.I-x Under the Action of Picosecond and Nanosecond Llaser Pulses", 1988, Phys. Stat. Sol. (b) 158: 359-66 (1988).
Kageshima, H. et al., "InGaAs/GaAs photorefractive multiple quantum well device in quantum confined Stark geometry." Appl. Phys. B 72, 685-689 (2001).
Kambe et al., "Refractive Index Engineering of Nano-Polymer Composites," NanoGram Corporation, Fremont, CA and SRI International, Chemical Science and Technology Lab, Menlo Park, CA (Spring 2001).
Kornowski, A. et al., "Preparation and Photophysics of Strongly Luminescing Cd.sub.3P.sub.2 Quantum Dots", J. Phys. Chem, 1996, 100: 12467-71 (1996).
Kuebler et al., "High-Sensitivity Material Systems for Two-Photon Three-Dimensional Microfabrication," Proceedings of SPIE—The International Society for Optical Engineering, vol. 5347, p. 111-117 (2004).
Matiradonna et al., "Nanopositioning of Colloidal Nanocrystal Emitters by Means of Photolithography and E-beam Lithography," Physica Status Solidi, vol. 243 (15), p. 3972-3975 (2006).
Murray, C.B. et al., "Sythesis and Characterization of Monodisperse Nanocrystals and Closed-Packed Nanocyrstal Assemblies," Annu. Rev. Mater. Sci., 30:545-610 (2000).
Nagase et al., "Super-Resolution Effect of Semiconductor-Doped Glass," Jpn. J. Appl. Phys., vol. 38 (1999), p. 1665-1668, Part 1, No. 3B (Mar. 1999).
Noharet, Bertrand, "Harnessing light with semiconductor Spatial Light Modulators," Aperturen—Surfaces and Imaging, vol. 1-2001, p. 12-13, XP002363385 (2001).
Nomura, S. et al., "Clearly resolved exciton peaks in CdS.sub.xSe.sub.I-x microcrystallites by modulation spectroscopy", Sol. Stat. Comm., 73: 425-9 (1990).
Ooki, Hiroshi et al., "Experimental study on non-linear multiple exposure method," SPIE vol. 3051, p. 85-93, Santa Clara, California (Mar. 12-14, 1997).
Scaiano, J.C. et al., "Photochemistry of Organic Reaction Intermediates: Novel Reaction Paths Induced by Two-Photon Laser Excitation," Acc. Chem. Res. 1988, 21, 22-29 (1988).
Scalfani, A. et al., "Effect of silver deposits on the photocatalytic activity of titanium dioxide samples for the dehydrogenation or oxidation of 2-propanol," J. Photochem. Photobiol. A: Chem. 1991, 59, 181 (1991).
Shibuya, Masato et al., "Performance of Resolution Enhancement Technique Using Both Multiple Exposure and Nonlinear Resist," Jpn. J. Appl. Phys., vol. 33 (1994), p. 6874-6877, Part I, No. 12B (Dec. 1994).
Simburger, H. et al., "Photoreactions in polymers containing benzil units: a comparative study under excimer laser and Hg-lamp irradiation," Polymer 41 7883-7897 (2000).
Sugita, Kazuyuki et al., "Photodegradation mechanism of phenyl isopropenyl ketone-methyl methoacrylate copolymers in the solid phase and their performance as a deep UV resist," Can. J. Chem. 73: 1841-1848 (1995).
Wu, En-Shinn et al., "Two-photon lithography for microelectronic application," Proc. SPIE vol. 1674, p. 776-782, Optical/Laser Microlithography V., John D. Cuthbert; Ed. (1992).
Zimin, L.G. et al., "Room-temperature Optical Nonlinearity in Semiconductor-doped Glasses", Phys. Stat. Sol. (b) 150:653-6 (1988).
Internet Article, "Negative e-beam resist SAL603-0.45" (date unknown).
English Translation of JP 7-220990 (Aug. 18, 1995).
Extended European Search Report and Written Opinion of the Examiner issued in corresponding European Patent Application No. 07 796 704.0 (Oct. 21, 2009).
International Search Report and Written Opinion issued in corresponding PCT Application No. PCT/US07/15539 (Jun. 16, 2008).
Office Action issued in corresponding Chinese Patent Application 200480012054.4, including English language translation (Oct. 31, 2008).
Supplementary European Search Report for European Application No. 04 80 9308 9 (Jul. 2, 2009).
Office Action dated Sep. 26, 2014, issued in corresponding Korean Patent Application No. 10-2009-7002626.

* cited by examiner

BLOCK CO-POLYMER PHOTORESIST

CROSS-REFERENCE TO RELATED APPLICATIONS

This non-provisional application claims the benefit of priority from U.S. Provisional Application Nos. 61/597,526 and 61/597,544 filed 10 Feb. 2012. This Application is related to co-pending commonly-assigned U.S. patent application Ser. No. 11/774,171 filed 6 Jul. 2001, which application claims the benefit of priority from Provisional Application No. 60/806,877 filed 10 Jul. 2006, and Provisional Application No. 60/870,795 filed 19 Dec. 2006; application Ser. No. 13/189,143 filed 22 Jul. 2011, which application is a divisional application of U.S. patent application Ser. No. 12/415,013 filed 31 Mar. 2009; which is a divisional application of U.S. patent application Ser. No. 10/792,377 filed 4 Mar. 2004, now U.S. Pat. No. 7,524,616 issued 28 Apr. 2009; which application claims the benefit of priority from Provisional Application No. 60/451,240 filed 4 Mar. 2003. The entire contents of each of these prior disclosures is incorporated herein by reference in their entirety and for all purposes as if expressly set forth herein.

FIELD

This patent application relates to advanced materials for lithographic patterning, and more particularly to photoresist materials for use in lithography, and more particularly to photoresists which make use of the self-assembly of block copolymer materials and to methods for using said materials to form patterns on semiconductor substrates.

BACKGROUND AND SUMMARY

Photoresists in Lithography

Lithography, in general terms, is the process of printing or transferring a pattern onto a surface. Optical lithography plays an important role in the production of semiconductor devices, among other things. In semiconductor lithography patterns of conductors and insulators are written onto a semiconductor substrate. One technologically important use of semiconductor lithography is in the production of an integrated circuit (IC). In an IC, lithography is typically used to write patterns of insulators, conductors, doped regions, etc. onto a semiconductor substrate, usually a silicon wafer. These patterns, once written, are then used to control the electric fields and electric currents within the IC. Advances in semiconductor lithography are important for the industry since lithography often tends to be the technical limiter for further advances in transistor size reduction.

A simplified view of a generic optical lithographic process is as follows. Photoresist material is deposited onto the substrate or an intermediate layer which is to be patterned by means of a deposition process, such as, but not limited to spin casting, drop-casting, or spray-casting. Photoresist (or resist), is a polymeric material which undergoes a chemical reaction, or series of chemical reactions, upon exposure to light. Then light from a light source is passed through a photomask, which lies between the light source and said substrate and serves to introduce a pattern into the light, also known as the aerial image. The patterned light impinges upon the photoresist layer where it exposes the resist. There are a variety of methods for exposing the resist including, but not limited to contact lithography, proximity lithography, projection lithography and immersion lithography. Upon exposure, the exposed area of the resist undergoes a chemical change, creating what is known as a latent image in the resist. This light induced chemical change usually leads, either directly or indirectly, to a change in the solubility of the resist. The resist is then developed, a step which translates the chemical changes in the resist into a change in the coverage of the resist on the substrate by removing selected areas of the resist. The physical pattern in the resist is then transferred to the underlying substrate by various means, including, but not limited to: etching of the substrate, deposition of conductors or semiconductors, and ion implantation. Methods of etching the substrate include, but are not limited to: wet etch, plasma etch, and reactive ion etch (RIE). In this manner a pattern can be transferred onto the semiconductor substrate. In order to create more complex structures on the semiconductor substrate, the light exposure and physical pattern transfer steps (deposition/etch/ion implantation/etc.) may be repeated a number of times, with the same or different light mask patterns, with each subsequent pattern being aligned with the previously transferred pattern on the wafer.

The light driven chemical reactions which occur in the photoresist are most often utilized to selectively change the solubility of the light exposed regions of the polymer, allowing the selective removal during later processing. The ranges of the electromagnetic spectrum from the light source which are used to expose the resist in optical lithography, may be chosen from a wide variety of ranges, including, but not limited to: visible light, ultraviolet (UV) light, extreme ultraviolet (EUV) light, electron beams, ion beams and x-rays. The light sources may be relatively more monochromatic or polychromatic in nature. Also within these different light ranges, a variety of wavelengths may be chosen. Wavelengths for optical lithography include, but are not limited to: 435 nm, 365 nm, 248 nm, 193 nm, and 157 nm. For the case of positive resists, the resist become more soluble in developer upon exposure, and thus the exposed areas may be selectively removed during development. The opposite is true for negative resists, where the resist becomes less soluble upon exposure. A wide variety of different chemical mechanisms have been exploited for both positive and negative. Two broad classes of resists are the conventional resists and the chemically amplified resists. In both classes of resist, the structure and etch resistance of the films are provided by the polymeric resin.

In conventional resists, mainly exposed with 436 nm and 365 nm light, the absorption of light by a photoactive compound (PAC) leads directly to a change in the solubility of the resist. Common examples of conventional resists include the diazonaphthoquinone (DNQ)/novolac family of resists. These positive resists are composed of DNQ, a PAC, mixed with a novolac resin. DNQ inhibits the dissolution of the novolac resin by the developer solution. Upon absorption of a photon the DNQ is converted to a carboxylic acid. The presence of the carboxylic acid acts to increase the solubility of the resin in the developer, leading to the efficient removal of the exposed areas of the resist during development.

In chemically amplified resists, by way of contrast with conventional resists, the product of the photochemical reaction does not appreciably change the solubility of the resist resin directly. Instead, in a chemically amplified resist the light is absorbed by a chemical species which as a result of the absorption process generates another active chemical species which then in turn can catalyze reactions in the resin to change the resin's solubility. One group of such photochemical generators, which are widely utilized in chemically amplified resists are photoacid generators (PAGs). As a result of the absorption of a photon the PAG generates an acid. During a post exposure bake (PEB), the resin then undergoes thermally induced reactions catalyzed by the photogenerated acid, resulting in a change in solubility for the resist. One non-limiting example of a thermally induced reaction which may take place in a positive tone chemically amplified resist, is the acid catalyzed deblocking of the resin. The deblocked resin can be much more soluble in the developer solution and thus be removed. A non-limiting example of a thermally induced reaction which may be exploited for a negative tone resist, is the acid catalyzed activation of a cross linking agent. The cross-linked, and thus effectively higher molecular weight resin, may be significantly less soluble in the developer solution and thus selectively remain behind during the development stage. In addition to photoacid generators, there are also other photochemical generators, such as photobase generators and photoradical generators, which generate bases and radicals respectively upon the absorption of light, which may be utilized in chemically amplified resists. Recently there has been exploration of negative tone development. In negative tone development, a traditional chemically amplified resist, which are currently being used in leading edge lithography production as positive resists, is used but the developer is replaced with an organic solvent that dissolves the blocked portion of the resin.

The smallest feature size that can be printed by an optical lithography system, also referred to as the resolution of the system, is determined by two main factors. These are the smallest image features that can be projected onto the substrate and the ability of the photoresist to resolve the image and translate that image into a latent chemical image. The first factor is mainly determined by the feature size of the mask, the wavelength of light used to create the aerial image and the numerical aperture, in the case of projection optical lithography. The resolving power of the photoresist depends on the type of resist, i.e. conventional or chemically amplified, and the specifics of the resist. In chemically amplified resists there is a relationship between the resolution, line-edge roughness, and sensitivity of the photoresist, known as the RLS triangle. In simple terms it states that only two of the three properties can be optimized in the formulation of the resist. For example, a high resolution resist which can produce features with low line-edge roughness, will, according to this relationship suffer from low sensitivity. The ability to produce a photoresist which can combine all three desirable properties may enable new technologies.

Block Copolymers

Polymers are macromolecules which are composed of smaller repeating structural units, often referred to as monomers, chemically bound to each other. Homopolymers are polymers in which the constituent monomers are chemically identical. Copolymers are a class of polymers which are composed of at least two different monomeric species. Block copolymers are copolymers in which the different monomeric species are segregated into homopolymer subunits or blocks which are covalently bonded to each other. At the juncture of the homopolymer blocks there may also be an intermediate subunit added for the sake of chemical compatibility. In conceptual terms then, a block copolymer can be thought of as two or more discrete homopolymers linked covalently end to end. Block copolymers composed of two and three homopolymer blocks are known as diblock copolymers and triblock copolymers, respectively. Block copolymers with even more blocks are also known.

The different blocks, may have properties which make it energetically unfavorable for them to mix with each other at a molecular scale, thus resulting in the phase separation of the different blocks. One example may be the case of amphiphilic block copolymers, where one block is lipophilic and the other block is hydrophilic. The resulting copolymer chain therefore is a single molecule which will mix with other copolymer chains in a way to create a polymeric material which can have chemically distinct periodic domains created by the phase separation of the different polymeric blocks. Bulk or macroscopic phase separation cannot result because the blocks are bound to each other in a single polymer chain. The result is that the blocks within the block copolymer self-assemble into repeating patterns (or arrays) of small domains.

The domains created by the phase separation of the block copolymers can be made to have a variety of sizes and shapes and geometries depending upon several factors but mostly due to the relative lengths of the homopolymer blocks. The sizes of the block copolymer domains may vary a good deal depending upon the exact makeup of the copolymer, but sizes usually vary in the range of 5 to 50 nm. The natural period of the block copolymer is often used when describing the size of the domains in the block copolymer. The natural period, $L_0$, is the defined as twice the length of the block copolymer in its ordered state (H. Kim, W. D. Hinsberg, *J. Vac. Sci. Technol.* A 22 (6), 2008, 1369). For the case of an ideal diblock copolymer the geometry or morphology of the resulting domains changes as a function of the relative chain lengths of the homopolymer blocks and thus by extension the volume fraction of a given block. For example, for a diblock copolymer with a low volume fraction of one block, the minority blocks form spherical domains arrayed within the bulk of the majority polymer. At higher fractional volumes of one block, the minority blocks form cylindrical domains which are arrayed in a hexagonal fashion within the bulk of the majority polymeric block. For an ideal diblock copolymer where the relative amount of one block is about the same as the other domain, the two blocks create parallel lamellar domains.

The thickness of a block copolymer film can also strongly influence the phase separated block domain structure or morphology. This is mainly due to the way in which changing the thickness of the film changes the relative important of the interactions of the copolymer at the block copolymer/air and block copolymer/substrate interface. For films thinner than the natural period of the block copolymer, $L_0$, the formation of equilibrium type domains may be frustrated by the increased importance of the block copolymer interfaces. This usually results in the formation of complex morphologies. For the formation of patterns which are more typically of interest to lithography, the desired film thickness is on the order of the natural period of the block copolymer, $L_0$. In this range the effect of the interfaces usually has more influences over the long range ordering or directionality of the domains rather than the shape of the domains. The domain shapes and sizes for films in this thickness range are typically closer to those for bulk block copolymers where the effects of the interfaces are minimized.

Deposition of block copolymer films can be performed by a variety of methods, including, but not limited to drop-casting, spin-casting, dip-coating, or spray-casting. After being deposited, the block copolymers are usually not in an equilibrium or near-equilibrium state, i.e. they have not formed the morphology of the phase separated domains which would minimize the energy of the film. An anneal step, or series of annealing steps, are then used to drive the morphology in the direction of equilibrium or near equilibrium structures and create a film with the desired self-assembled domains made up of the blocks of the copolymer. These thermal annealing step usually raise the temperature of the block copolymers above the glass transition temperatures of the constituent blocks.

Lithographic Patterning with Block Copolymers

For years the ability of block copolymers to create patterns on the nanoscale has been well known. There have already been examples of copolymer thin films being used for in the creation of etching masks for the transference of patterns to a substrate as well as further promise of creating patterns where the domain sizes are in the range of interest for current and future lithographic features. Early work demonstrating the use of the phase separated domains in block copolymers to pattern a substrate date back to over 20 years. Thin films of block copolymers may be formed on a substrate and various processing methods, such as selectively etching one block of the copolymer, may then be used to transfer the pattern to the substrate. The resulting patterns may be smaller than what can be easily achieved by purely optical methods. The patterning of block copolymers can potentially supplement optical lithography in making certain patterns with feature sizes that are comparable to or smaller than what is achievable with more conventional means and often in a simpler or cheaper manner.

While the range of domain geometries fall loosely within the three listed above (lamellar, cylindrical, and spherical) these geometries can be used to create at least two important lithographic patterns. For example, thin films of block copolymers with spherical domains or cylindrical domains orientated perpendicular to the substrate may be used to make via or point contact patterns. In a similar fashion, both lamellar and cylindrical domains orientated parallel to the substrate may be used to create line-space patterns.

Since the size of the pattern features given by block copolymer domains and their sharpness directly relate to the size and chemistry of the blocks which make up the copolymer, the control of the dimensions of the repeating domains and their short range ordering can be quite robust. However, the use of block copolymers to generate lithographic patterns can often be limited by a relative lack of longer range order. Long range order is defined as length scales of several natural periods of the block copolymer, compared to localized or short range order, which would be in the range of one to two natural periods. For example, if a line-space pattern with equal-lined, equal-spaced distances is desired, a block copolymer may be composed and spin cast onto a substrate in such a way as to create a lamellar structure with lines and spaces determined by the respective and absolute sizes of the various blocks, among other factors. The pattern created by the block copolymer may have very good short term order, i.e. the dimension of the domains which will make up the spaces and the lines may be as desired and the lines and spaces may be parallel, but simply drop casting the film of block copolymers may not create long range order, i.e. with all the lines and spaces running straight from one end of the substrate to the other and oriented in the correct manner.

There are many ways to maximize, or at least to increase, the long range order of the block copolymers, including, but not limited to: increased film annealing times in the presence of solvent vapor, directional solvent vapor evaporation techniques, the introduction of shear forces, the use of a temperature gradient, and directed self-assembly. From a lithographic standpoint, the most useful methods for introducing more long range control over the alignment and orientation of the domains within the block copolymer are the methods of directed self-assembly. In these methods the long range order is transferred to the block copolymer from patterns previously written into the substrate. The use of these methods may often require the use of complementary lithographic techniques. Two of these methods to help introduce long term order into patterns of are known as chemical epitaxy and graphoepitaxy.

In both of these methods, the substrate or a thin film deposited on the substrate has a background pattern already written into it. The features of this pattern are usually larger than the desired feature size for the block copolymer and the main purpose is to create a long term ordering which the self-assembled pattern of the blocks of the copolymer can build upon. One example of this might be to use optical lithography to create a line and space pattern in a resist, hardmask, or substrate, with a relatively large feature size and then use the self-assembly of the block copolymers to perform a pitch division. Deposition of the block copolymer, previously optimized to create a lamellar type geometry, onto the coarsely patterned surface may then, with the aid of further processing, write finer lines and spaces aligned within these coarse features. In this example the coarse features written by the optical lithography would define the directionality and alignment of the finer domain features. In graphoepitaxy the chemistry of the walls and floors of the spaces can strongly effect the ordering of the phase separated block domains. For example, if features that are perpendicular to the substrate are desired, often the case for efficient pattern transfer of both lamellar and column type features, the "floor" of the space (substrate, hardmask, underlayer, etc.) should be neutral with respect to wetting by the two blocks of the block copolymer. If instead one block preferentially wets the surface, the pattern will tend to have components which may vary with the depth of the feature, which is significantly less desirable. The chemistry of the walls of the space can also play an important role in the final morphology and long range ordering of the block copolymer film.

For the case of chemical epitaxy, chemical differentiation on a flat surface is used to direct the self-assembly process, inducing long range order. These sparse patterns of chemical differentiation can be written by various techniques involving a variety of lithographic technologies, including optical and e-beam lithography. The chemistry which interacts with the blocks of the copolymer and directs the self-assembly are usually of a pinning or preferential wetting type. Features written with chemical differentiation potentially have better resolution (smaller line-edge roughness, etc.) than graphoepitaxy, but it is usually harder to write these chemical patterns.

Cleavable Block Copolymers

Recently there has been an interest in the development of cleavable block copolymer for a variety of uses including drug delivery and the production of nanoporous surfaces. Cleavable block copolymers are copolymers which can undergo a reaction to break the linkage between two of the blocks of the copolymer. This is usually achieved by placing a reactive chemical unit or linker between the neighboring blocks of a block copolymer. Under exposure to a specific stimulus the linker undergoes a chemical reaction, the end result of which being the breaking of the chemical bonds within the linker or between the linker unit and one or both of the blocks of the copolymer to which it is attached. Thus the block copolymer can be split into two separate segments along the juncture of two blocks. In the case of a block copolymer, the result would be to break the copolymer into two separate segments each containing only the one block and possibly fragments of the linker molecule. Several different linker groups with a variety of driving stimuli (photons, acid exposure, etc.) have been developed to this end. A non-exhaustive list of examples of photocleavable block copolymers (block copolymers which can be cleaved by exposure to light) include: block copolymers in which the linker is an ortho-nitrobenzyl group {Synthesis of Photocleavable Poly(styrene-block-ethylene oxide) and its Self-Assembly into Nanoporous Thin Films} or an anthracene photodimer {J. T. Goldbach, K. A. Lavery, J. Penelle, T. P. Russell *Macromolecules* 2004, 37, 9639.}, both of which can be cleaved by exposure to UV light. There are also examples of block copolymers which can be cleaved by exposure to an acid. Examples of this include block copolymers with a triphenylmethyl (trityl) ether linkage {M. Zhang, L. yang, S. Yurt, M. J. Misner, J. Chen, E. B. Coughlin, D. Venkataraman, T. P. Russell, "Highly Ordered Nanopourous Thing Films from Cleavable Polystyrene-block-pol(ethylene oxide)" *Adv. Mater.* 2007, 19, 1571.}, a tert-butyl carbamate linker {M. A. DeWit, E. R. Gillies, "A cascade Biodegradable Polymer Based on Alternating Cyclization and Elimination Reactions" *J. Am. Chem. Soc.* 2009, 131, 18327.}, a diphenyl methyl ether linkage {S. K. Varshney, J. Zhang, J. Ahmend, Z. Song, V. Klep, I. Luzinov, "Synthesis of poly(styrene-block-ethylene oxide) copolymers by anionic polymerization and acid cleavage into its constituent homopolymers for the formation of ordered nanoporous thing films" *e-Polymers* 2008, 94.}

SUMMARY

Herein we describe a new photoresist, which we shall refer to as a block copolymer photoresist (BCP) which combines some of the patterning attributes and capabilities of a directed self-assembled block copolymer with a conventional photoresist. Herein we also describe several methods for patterning with this advanced resist and methods for making integrated circuits and small features. In a conventional photoresist the location, size, and line edge roughness of the features are defined (at least in significant part) by the pattern of the actinic radiation. This can limit the resolution of the final features to be written as well as increasing the complexity of the exposure and subsequent processing steps necessary for writing certain patterns lithographically. In a BCP the size, shape, and line edge roughness of the features to be written are determined by the block copolymer. This may allow the lithographic performance of BCPs to break free from the RLS triangle. The exact location of the feature(s) to be written depends on a combination of the directed self-assembly of the block copolymer and the patterning of the actinic radiation used to expose the photoresist. The block copolymer photoresist will be designed to lay out a pattern of phase separated domains onto the substrate after deposition and annealing There are a variety of different domain morphologies for the block copolymer photoresists that may be desirable, including, but not limited to, lamellar domain morphologies for the creation of line and space patterns on the substrate and columnar block morphologies set perpendicular to the substrate for the creation of contact hole patterns. The location of these phase separated domains on the substrate may be directed by a variety of means including, but not limited to graphoepitaxy and chemical epitaxy. Actinic radiation will then be used to expose chosen domains of the block copolymer. This selective exposure to actinic radiation will cause a chemical reaction or series of chemical reactions which will ultimately allow for the selective removal of chosen domains of the block copolymer upon further processing. BCPs may be used with conventional optical lithography, (including exposure at the g, h, i lines or 248 nm, 193 nm, 157 nm), EUV lithography, or charged particle lithography.

As an illustrative non-limiting example, the use of BCPs may allow for a lithography process to create small dense features with low line edge roughness at relatively low doses compared to a conventional resist. BCPs may also be designed to be more absorbing than a conventional resist. In current photoresists, the resist must be transparent enough to the exposure radiation to ensure that the exposure dose for the top of the resist is similar to the exposure dose at the bottom of the resist. This will help ensure the sidewalls of the features are approximately perpendicular to the substrate. This constraint may be relaxed for BCPs. This is due to the fact that the geometry of the sidewalls will be determined by the interface between the block domains of the block copolymer and not by exposure. A more absorbing resist may be advantageous since it can make more efficient use of the exposing actinic radiation. For example the BCP could absorb more than 99%, 98%, 97%, 96%, 95%, 90%, 85%, 80%, 75%, 70%, 65%, 60%, 55%, 50%, 45%, 40%, 35%, 30%, or 25% of the incident light.

As an illustrative non-limiting example, BCPs may also take advantage of more chemical amplification than a conventional resist. While chemical amplification increases the sensitivity of the resist, in a traditional resist it reduces resolution and line edge roughness. In a BCP an acid could catalyze more than 100, 200, 300, 400, 500, 750, 1000, 1500, 2000, 2500, 4000, or 5000 chemical reactions As an illustrative non-limiting example, BCPs may be utilized in both single and multiple exposure patterning and may be used alone as a patterning layer or as part of a multilayer stack. The block copolymer photoresist may also be used with functional topcoats, such as contrast enhancement layers, which may allow for the printing of even smaller, denser patterns than without the enhancement layer. Also BCPs with non-linear absorption processes to drive the selective removal of part of the block copolymer photoresist may also increase the performance of this technology.

DETAILED DESCRIPTION OF PRESENTLY PREFERRED EXAMPLE ILLUSTRATIVE NON-LIMITING EMBODIMENTS

Materials

One preferred exemplary illustrative non-limiting embodiment provides for a block copolymer photoresist that is a cleavable block copolymer, which can undergo self-assembly to create a pattern of phase separated domains on a substrate. The self-assembly process may be directed by graphoepitaxy or chemical epitaxy. The linker group, at which the cleavage of the block copolymer will take place may be a variety of chemical units including, but not limited to: an ortho-nitrobenzyl group, an anthracene photodimer, triphenylmethyl (trityl) ether group, a tert-butyl carbamate group, a diphenyl methyl ether group, or any other groups that may be used to link two blocks of a block copolymer together and allow cleavage when exposed to various stimuli, including but not limited to: exposure to acid, base, or any other chemical agents as well as exposure to actinic radiation, etc. This linker group may be a molecule or may be a polymeric or oligomeric block itself, separating the blocks to be cleaved. There may be one or possibly more linker groups in the block copolymer, linking the different blocks to each other. The exact mechanism(s) used for the cleavage of the block copolymer may vary, but the cleavage will be initiated by exposure to actinic radiation. Some non-limiting examples include: the direct cleavage of bonds after the absorption of a photon by the linker group or bond breakage as the result of exposure to an acid generated by a photoacid generator (PAG). It is important to note that for these cleavable block copolymer types of resists in this exemplary non-limiting embodiment, the solubility altering reactions may take place at the interface domain interfaces, where the reactive inter-block linker groups are located as opposed to traditional resists where the solubility altering reactions take place in the bulk of the material. Therefore in a BCP, it is at this interface where the absorption of the photon must happen, in the case of a photo-driven process, or to which the acid or other reacting molecule must travel in order to promote cleavage. After the exposure of the BCP and subsequent cleavage reactions the original block copolymer resin may now exist in one of three chemically distinct forms: the intact original block copolymer, one segment of the block copolymer which contains at least one whole block of the original block copolymer, a second segment of the block copolymer which contains at least one whole block of the original block copolymer. The solubility of each of the two segments of the block copolymer may now be determined by the chemistry of the segment itself rather than the whole block copolymer. The blocks of the copolymer may be designed so that upon cleavage, at least one of the polymeric segments will be soluble in developer, while at least one of the polymeric segments will be insoluble in developer. This may allow for the selective removal of certain domains of the block copolymer as the result of exposure to actinic radiation. The remaining domains of the block copolymer can then be used to transfer the pattern to an underlying substrate by a variety of means including, but not limited to: etching, deposition, or ion implantation.

Figure 1:
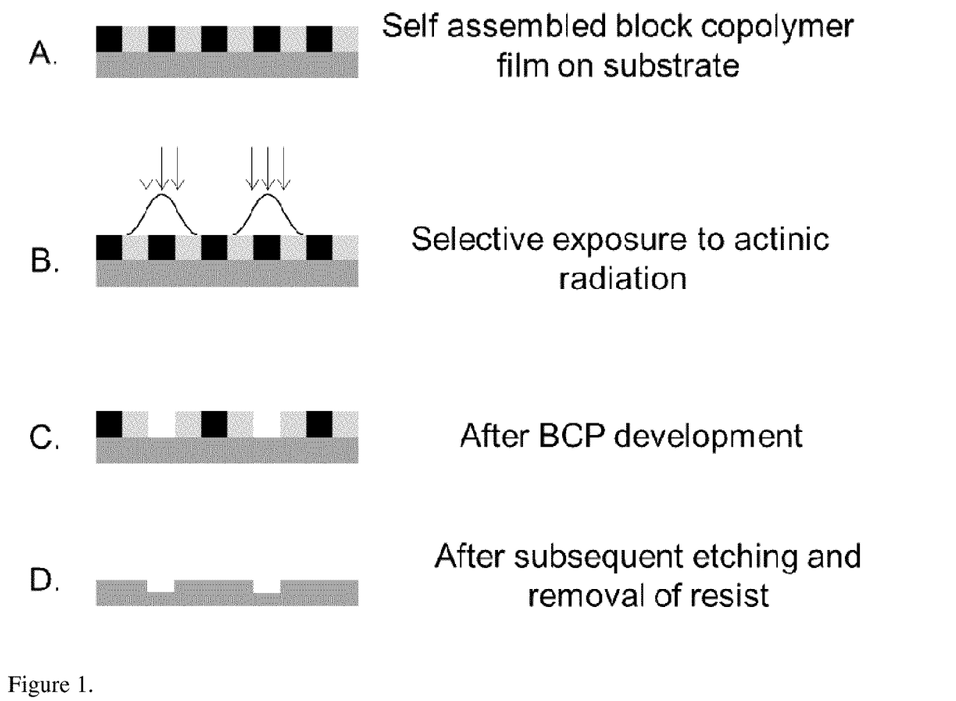
FIG. 1 A Scheme for use of positive tone BCP

One preferred exemplary illustrative non-limiting embodiment provides for a positive tone BCP. The main constituent of the BCP is a block copolymer that is not soluble in the developer and when cleaved, one fragment is soluble and the other fragment is insoluble in the developer. The self-assembly of the BCP may be directed by graphoepitaxy or chemical epitaxy. FIG. 1 illustrates a generic patterning scheme using a positive tone BCP made from a cleavable diblock copolymer followed by reactive ion etching. 1A shows the periodic pattern of the BCP created by self-assembly of the film on the substrate. The dark and light shadings of the film on the substrate reflect the different chemistries of the blocks which make up the phase separated domains of the self-assembled block copolymer. In this illustration the phase separated blocks in the BCP have a lamellar-type domain morphology after annealing. Selective exposure of the BCP to actinic radiation is then shown in 1B followed by the development of the BCP in FIG. 1C and transferring of the BCP pattern in 1D by means of etching. The selective exposure areas are indicated by the arrows in FIG. 1B. Also shown above the blocks in 1B is the spatial intensity distribution of the exposure light, for this case it is illustrated as a diffraction limited pattern. The pattern of exposure needs to correspond only loosely to the desired final pattern, since the final shape of the feature sidewalls will reflect the location of the chemical transition between the block domains, rather than just the dosing location. In the figure light is shown impinging the domains immediately next to the domain desired, but having no effect on the final image quality. In this positive tone BCP, the blocks in which the domain interfaces directly surrounding it have undergone cleavage, either by direct illumination or by reaction with the photo-created reagents, such as photogenerated acid, will have solubility that is directed by the block or block segments within that now segmented domain, while the intact (uncleaved) block copolymers will retain their insolubility in the developer solution. Therefore the segments and blocks which are soluble will be selectively removed during the development step(s). The pattern of the remaining BCP can then be transferred to the substrate below by further processing and pattern transfer steps, including, but not limited to: etching, ion implantation, and deposition.

Figure 2:
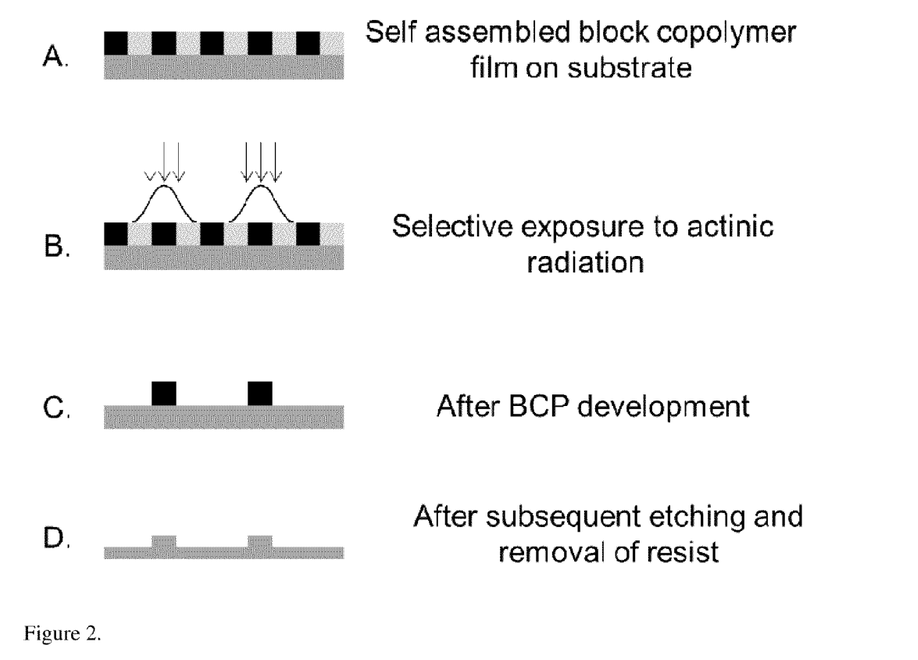
FIG. 2 A Scheme for use of negative tone BCP
Figure 3:
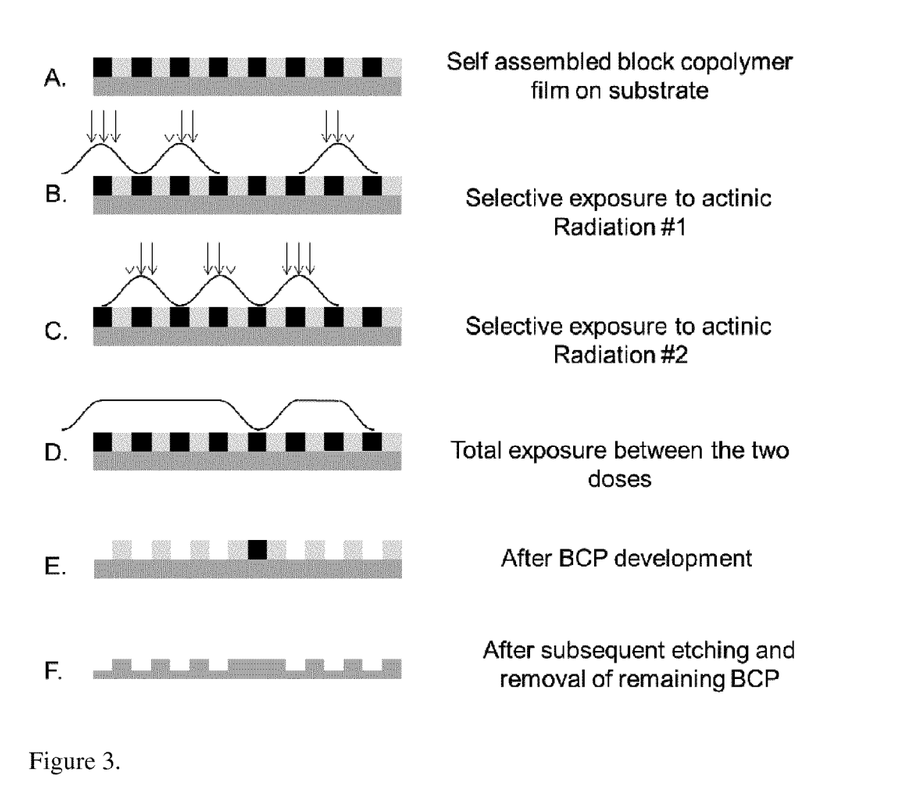
FIG. 3 A double exposure scheme for use of positive tone BCP
Figure 4:
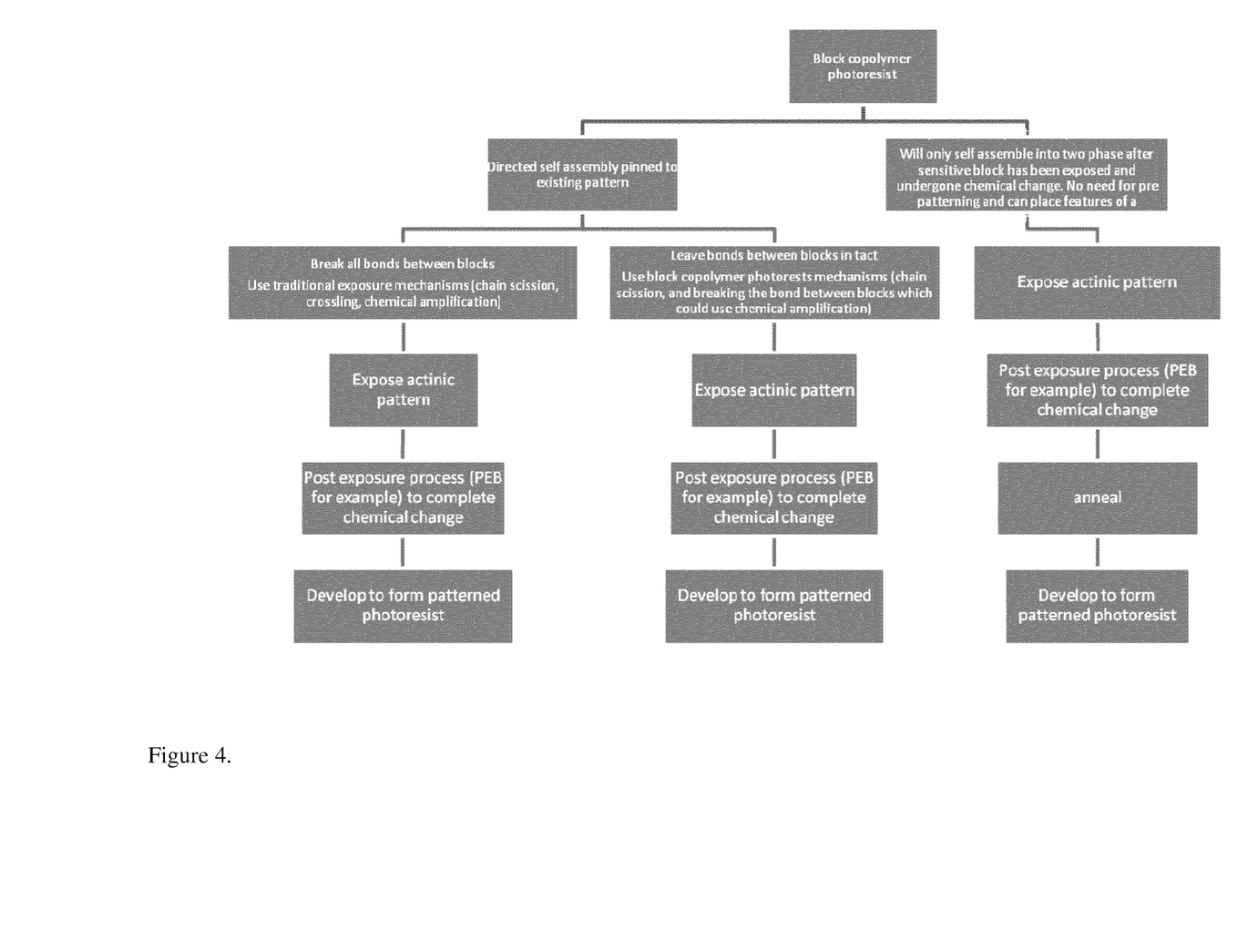
FIG. 4 A block flow diagram showing the use of BCP for patterning a substrate FIG. 5 A Scheme for use of a pinning layer with a locally self assembling BCP
Figure 5:
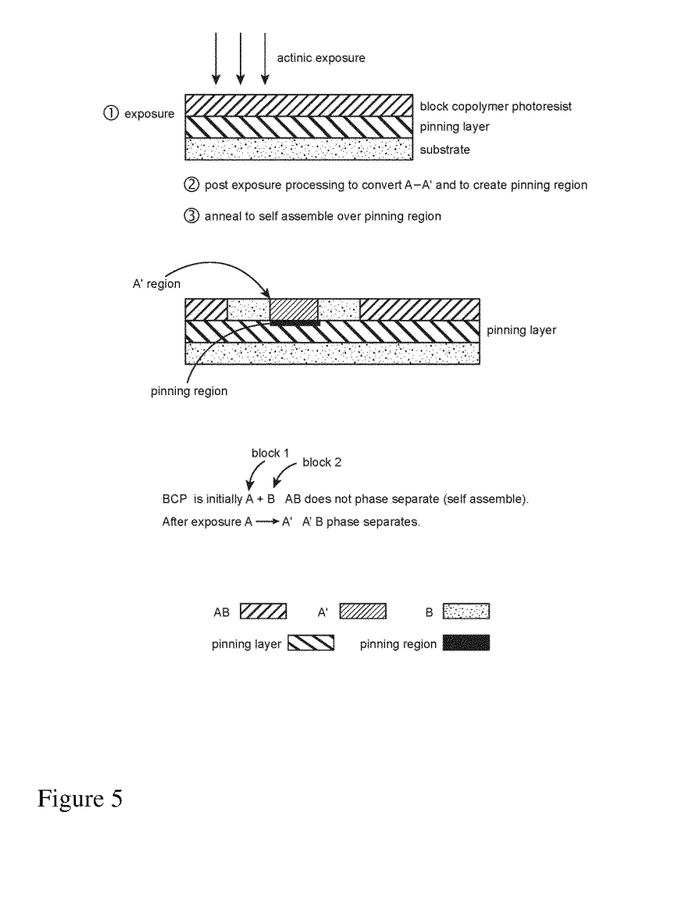

Another preferred exemplary illustrative non-limiting embodiment provides for a negative tone BCP. In a negative tone BCP, the block copolymer itself is soluble in the developer and upon cleavage one fragment is soluble, while the other fragment is insoluble. The self-assembly of the negative tone BCP may be directed by graphoepitaxy or chemical epitaxy. Negative tone BCPs may allow for the creation of patterns not available to positive tone BCPs or the use of negative tone BCPs may make it simpler to fabricate these features. An example of a generic negative tone BCP is shown in FIG. 2. In negative tone BCPs, the constituents resins in the domains filled with block copolymer segments which have undergone cleavage reactions, either by direct illumination or by reaction with the photo-created reagents, such as photogenerated acid, will have solubility that is controlled by the block or block segments within that cleaved domain, while the intact (uncleaved) block copolymers will retain their solubility in the developer solution. Therefore both the intact block copolymers and the selectively segmented blocks which are now soluble will be selectively removed during the development step(s). The pattern of the remaining BCP can then be transferred to the substrate below by further processing and pattern transfer steps, including, but not limited to: etching, ion implantation, and deposition.

Another preferred exemplary illustrative non-limiting embodiment is a positive tone BCP, where the block copolymer used as the main component of the resist in addition to being cleavable may also undergo chemistry changes as a direct or indirect consequence to the exposure to actinic radiation which may change the solubility of one or both of the cleaved segments. These blocks may be designed to exploit mechanisms currently in use for conventional or chemically amplified photoresists to change solubility, including, but not limited to chain scission, deblocking of functional groups, and crosslinking of the polymeric chains. In the case of chemically amplified photoresists PAG may be included in the block copolymer dispersion as it is deposited or it may be bound to the block copolymer itself. The change in solubility of one or more of the cleaved blocks of the block copolymer may allow for easier selective removal of the desired blocks during the development of the resist due to the increased dispersibility contrast between the blocks. This may improve the functionality or performance of the simple cleavage resists described above in a variety of ways. For example, it may be desirable for the areas just adjacent to the domains to be removed to become cross-linked by the exposure, in order to limit any defects or line edge roughness that may otherwise be formed during the removal of the cleaved polymer sections during development. Another useful example may be the inclusion of chemistry within the area to be removed by subsequent development which would make it even more dispersible in the developer solution, say by chain scission reactions or deblocking of functional groups which would make it soluble in the developer.

Another preferred exemplary illustrative embodiment is a negative tone BCP, where the block copolymer used as the main component of the resist in addition to being cleavable may also undergo chemistry changes as a direct or indirect consequence to the exposure to actinic radiation which may change the solubility of one or both of the cleaved segments. These blocks may be designed to exploit mechanisms currently in use for conventional or chemically amplified photoresists to change solubility, including, but not limited to chain scission, deblocking of functional groups, and crosslinking of the polymeric chains. In the case of chemically amplified photoresists PAG may be included in the block copolymer dispersion as it is deposited or it may be bound to the block copolymer itself. The change in solubility of one or more of the cleaved blocks of the block copolymer may allow for easier selective removal of the desired blocks during the development of the resist due to the increased dispersibility contrast between the blocks. This may improve the functionality or performance of the simple cleavage resists described above in various ways. As a non-limiting example, for the case of a negative BCP, it may be desirable in this case to have the fragments which have been exposed and are desired to stay on the substrate made even more insoluble in the resist upon exposure, say by a mechanism such as cross-linking During development this may result in more of the block domain which is desired to not be removed, to be left intact, thus increasing the fidelity of the pattern.

Another preferred exemplary illustrative non-limiting embodiment is for a BCP, which is not composed of a cleavable block copolymer, but instead is composed of a block copolymer in which one or more blocks of the copolymer are removed by other methods as a result of exposure to actinic radiation. The self-assembly of this type of BCP may be directed by graphoepitaxy or chemical epitaxy. One non-limiting example of this, is having a block or blocks which undergo chain scission or some other kind of degradation due either to direct exposure to light or as a result of exposure to a reagent generated by exposure of the BCP to actinic radiation, such as photoacid generated by PAG. PMMA is one non-limiting example of a block which can form block domains as part of a block copolymer and can be directly decomposed by exposure to deep ultraviolet radiation and can subsequently be removed by further processing, i.e. washing with acetic acid. {T. Thurn-Albrecht, J. Schotter, G. A. Kastle, N. Embley, T. Shibauchi, L. Krustin-Elbaum, K. Guarini, C. T. Black, M. T. Tuominen, T. P. Russell "Ultrahigh-Density Nanowire Arrays Grown in Self-Assembled Diblock Copolymer Templates" Science 2000, 290, 2126.}

Another preferred exemplary illustrative non-limiting embodiment is for a block copolymer photoresist in which the chemistries of the constituent blocks are designed to allow for selectivity in the mobility of photogenerated chemical species in the deposited film of the BCP. These photogenerated chemical species may include, but are not limited to: photoacid generated by the absorption of actinic radiation by a photoacid generator, photobase generated by the absorption of actinic radiation by a photobase generator, and photoradicals generated by the absorption of actinic radiation by a photoradical generator. The chemistry of the blocks may be such that the chemical species generated by a photogenerator would have significantly enhanced mobility in the areas where it is desired for the block copolymer to undergo the reactions which are catalyzed by the photogenerated species. One example would be the enhanced mobility of the photoacid in the block domains composed of the blocks which are designed to be soluble upon scission in a cleavable positive tone resist. The enhanced mobility of the acid within these blocks when compared to the other blocks would allow for a very sensitive resist, where relatively low levels of light may be necessary to fully exposure the domains or where PAG concentration can be enhanced without having the generated acid move to other domains of the same type due to the slowed mobility in the contrasting domains. This enhanced mobility may be understood to apply to any chemical species which are photogenerated and which either catalyze or act as a reagent in chemical reactions which results in the cleavage of the block copolymer or in other manners induce chemical changes which ultimately result in the change in solubility of components of the BCP.

Another exemplary non-limiting illustrative embodiment provides for a BCP which is composed of more than one species of block copolymer or a blend of block copolymers. One or more of the block copolymers may be sensitive to actinic radiation and undergo cleavage or changes in solubility as a result of the exposure. The relative volume ratio(s) of the different block copolymers may take on a wide variety of values depending on the final pattern desired.

Another exemplary non-limiting illustrative embodiment provides for a BCP which is composed of one or more homopolymers added to the block copolymer or blend of block copolymers. One or more of the block copolymers or homopolymers may be sensitive to actinic radiation and undergo cleavage or changes in solubility as a result of the exposure The relative amounts of the homopolymer(s) to the block copolymer(s) may take on a variety of values.

Another exemplary non-limiting illustrative embodiment provides for a BCP in which the self-assembled domains of the BCP have been designed to have contrasting values for the index of refraction. This may allow for light to be "focused" into the phase separated domains with the higher value for the index of refraction, effectively increasing the sensitivity of the photoresist. It may prove beneficial to have the effectively increased light doses due to this focusing in areas which may contain the PAGs or the other photoactive compounds which absorb the light which initiates the reactions which ultimately result in the change in the solubility of selected domains of the block copolymer photoresist. The methods employed to create the index of refraction contrast between the domains may include, but are not limited to, the use of blocks to make up a block copolymer which natively have a relatively large difference in the index of refraction and the selective inclusion of high index filler materials into one or more of the domains of the BCP.

Another exemplary non-limiting illustrative embodiment provides for a BCP in which the self-assembled domains of the BCP have been designed to have contrasting values of light absorption at the wavelength or range of wavelengths used for the exposure of the BCP. This may allow for light to be "focused" into the phase separated domains with the higher absorptivity, effectively increasing the sensitivity of the photoresist. It may prove beneficial to have the effectively increased light doses due to this focusing in areas which may contain the PAGs or the other photoactive compounds which absorb the light which initiates the reactions which ultimately result in the change in the solubility of selected domains of the block copolymer photoresist. The methods employed to create the absorptivity contrast between the domains may include, but are not limited to, the use of blocks to make up a block copolymer which natively have relatively large differences in absorptivity, the modification of blocks within the block copolymer which add absorptivity to the blocks, and the selective inclusion of highly absorbing compounds into one or more of the domains of the BCP. In one exemplary non-limiting embodiment, the insensitive area of the resist could be more absorbing than the sensitive area. This would serve to help focus the light into the sensitive area.

Another exemplary non-limiting illustrative embodiment provides for a BCP in which the block copolymer that would not self assemble until it was exposed to actinic light. The light would initiate a change the chemical properties of one of the blocks such that the block copolymer would then self assemble. The layer below the block copolymer photoresist would be a pinning layer, that would be chemically changed by the actinic radiation to pin one of the phases. After the exposure of the pattern, the actinic light would initiate chemical reactions in one phase of the block copolymer to allow the block copolymer to locally self assemble. The actinic light would also chemically change the pinning layer to provide either a graphoepitaxial or preferably a chemical epitaxial pattern to direct the local self assembly of the pattern. The location of the pinning areas and the chemically altered block copolymer would be self aligned but the pinning layer would serve to prevent the block copolymer from moving around during subsequent processing. Both the block copolymer and the pinning layer may be designed to exploit mechanisms currently in use for conventional or chemically amplified photoresists to either initiate a local self assembly in the case of block copolymer or to initiate a chemical epitaxy pattern in the case of the pinning layer. For example both could use chemical amplification and or deblocking of functional groups. After the exposure, the wafer could be processed to allow completion of any chemical reaction initiated by the actinic light. In the case of chemical amplification and deblocking this could be a post exposure bake. Next the block copolymer would be annealed to allow the local self assembly directed by the light pattern. This step could occur simultaneously with the post exposure bake. If it occurs after the post exposure base it may be necessary to deactivate the photogenerated catalyst (e.g. photoacid, photobase, or photoradical) to control the amount of chemical amplification. This would allow arbitrary placement of features, they would not need to be aligned to a pre-existing pattern and would not need to be on a pre-determined pitch. The size of the feature would be determined by the length of the block that undergoes chemical changes and the space between the features would be determined by the length of the other block. The edges would be determined by the transition between the phases of the polymer. This would again allow us to have significant improvements of the existing RLS tradeoffs. This would also allow for different kinds of features in the same layer. The block copolymer would need to be sufficiently transparent to allow the light through to the pinning layer. Also the pinning layer could use non-linear processes to initiate the chemical epitaxy pattern. These non-linear processes would allow the pinning layer to have smaller patterns that could be placed closer together allowing for more precise placement of the desired features. This process could be used with multiple exposures to print features beyond the diffraction limit. The block copolymer could also use non-linear processes to initiate the chemical change to allow for self assembly.

Another exemplary non-limiting illustrative embodiment provides for a tri Block Copolymer Photoresist (triBCP) with three units A, B, and C. The B block would be in the middle of the triBCP, with Blocks A and C on the end. Blocks A and B would be chemically similar (for example A and B could have a low $\chi$ (Flory-Huggins Interaction parameter)) while block C would be chemically different (for example C could have a high $\chi$ with both A and B). The triBCP would self assemble under a certain set of annealing condition with A and B in one phase and C in the other phase. Upon exposure to actinic light, block B would undergo a chemical change to become B', which is chemically similar to block C and not to block A (for example B' and C could have a low $\chi$, while B' and A could have a high $\chi$, and A and C could still have a high $\chi$). The actinic radiation could induce a change from B to B' in a number of ways. B could have protection groups and a photoacid could be used in a chemical amplification process to de-protect B and change its chemical properties. The exposed triBCP would self assemble under a certain set of annealing conditions with A in one phase and B' and C in the other phase. The exposure would change the relative volume of the two phase and could result in either a change in feature size or a change the structures that formed (for example a change from cylinders to lamellae or vice versa). This change would be determined by the relative volume of block B.

Methods

One preferred exemplary illustrative non-limiting embodiment provides for a block copolymer photoresist which can be used alone to transfer a pattern to the underlying substrate. The pattern to be written to the substrate is a result of the combination of the pattern of the block domains made after deposition and any annealing or aligning steps that may be necessary and a pattern of actinic radiation. The actinic radiation may act to "turn on" or "turn off" certain domains are regions of domains in the block copolymer pattern in order to create the pattern that is to be written to the underlying substrate. The annealing and alignment steps used to aid in the creation the pattern of block domains within the block copolymer photoresist may include, but are not limited to: external electric fields, temperature gradients, solvent annealing, etc. {S. H. Kim, M. J. Misner, T. Xu, M. Kimur, T. P Russell "Highly Oriented and ordered arrays from Block Copolymers via Solvent Evaporation", Adv. Mater. 2004, 16 (3), 226.} As an example PS-b-PEO block copolymers, with a PS weight fraction of 0.75, have been deposited as films and solvent-annealed in benzene to produce a phase separated block morphology of horizontally ordered arrayed cylinders of PEO in a PS matrix which are oriented perpendicular to the substrate on which they are grown. {S. H. Kim, M. J. Misner, T. Xu, M. Kimur, T. P Russell "Highly Oriented and ordered arrays from Block Copolymers via Solvent Evaporation", Adv. Mater. 2004, 16 (3), 226.} Furthermore, PS-b-PEO block copolymers with a photo-cleavable linkage ortho-nitrobenzyl (ONB) group between the PS and PEO have been synthesized and self-assembled into films. {Synthesis of Photocleavable Poly(styrene-block-ethylene oxide) and its Self-Assembly into Nanoporous Thin Films} A cleavable block copolymer such as mentioned in the above reference would be deposited onto a substrate, such as a silicon wafer, by a process such as spin-casting. Subsequent solvent-annealing in the presence of benzene solvent vapor, as prescribed in the above reference, would create the desired morphology of the block copolymer domains, namely PEO cylinders arrayed regularly in a PS matrix, with the PEO cylinders oriented perpendicular to the substrate. Exposure to patterned actinic radiation would then selectively cleave the block copolymers which have linkers within the irradiation zone. Upon exposure to developer, for example an aqueous solution of TMAH, the PEO segments of the cleaved block copolymer would be removed, leaving behind a pattern which may be used as a mask to transfer the pattern to the underlying substrate by a variety of methods including, but not limited to etching of ion implantation.

In another preferred exemplary illustrative embodiment, the BCP may be utilized to print features beyond the diffraction limit of the light used to create the aerial image. The block copolymer photoresist is used to create a periodic pattern of phase separated domains on the surface to be patterned. The morphologies of the domains may take on a variety of shapes including but not limited to: an array of spherical domains dispersed regularly in a matrix, an array of column shaped domains arranged perpendicular or parallel to the substrate, or a series of lamellar domains. The location and alignment of the domains may be directed by either graphoepitaxy or chemical epitaxy. The size and shape of the features to be written onto the substrate are controlled by the by the size and shape of phase-separated domains of the block copolymer. The line edge roughness of the features depends on the sharpness of the interface between the block domains. The aerial image, which may be diffraction limited, serves only to choose which of the phase-separated domains are transferred to the substrate as features, by initiating reactions which ultimately result in a pattern of phase separated domains which may be selectively removed by development. The patterns of the remaining domains of the block copolymer, which may contain features smaller than allowed by the diffraction limit, may then be transferred to the underlying layers or substrate by a variety of methods including but not limited to: deposition, etching, and ion implantation.

In another preferred exemplary illustrative embodiment, the BCP may be used as a component in a multilayer stack. For example, the BCP may be sandwiched between an underlying hardmask and/or spin on carbon layers and conventional topcoat layers. The underlayers may provide increased etch resistance for pattern transfer to the substrate while the topcoat may provide anti-reflective properties or may be utilized as a protecting layer for the BCP, say during immersion lithography.

In another preferred exemplary illustrative embodiment, the BCP may be used in conjunction with a topcoat which is block copolymer. The block copolymer topcoat would be deposited onto the BCP layer after the self-assembly of the BCP. The self-assembly of the block copolymer topcoat may be directed by the pattern of the BCP layer. The block copolymer topcoat may be designed to have phase separated domains which have contrasting values for the index of refraction. This may allow for light to be "focused" by the topcoat domains with higher value for the index of refraction into selective underlying domains in the BCP layer. It may prove beneficial to have the effectively increased light doses due to this focusing in areas of the BCP which may contain the PAGs or the other photoactive compounds in the BCP layer.

In another preferred exemplary illustrative embodiment, the BCP may be used in conjunction with a topcoat which is block copolymer. The block copolymer topcoat would be deposited onto the BCP layer after the self-assembly of the BCP. The self-assembly of the block copolymer topcoat may be directed by the pattern of the BCP layer. The block copolymer topcoat may be designed to have phase separated domains which have contrasting absorptivity values at the wavelength or in the wavelength range used for exposure of the BCP. This may allow for further modification of the aerial image before it reaches the BCP since light of the same intensity that passes through topcoat domains with higher absorptivity will have lower intensity once they reach the BCP layer with respect to light that has passed through the topcoat domains with lower absorptivity. This may allow for the printing of patterns which are otherwise unobtainable or it may make the printing of these features more easily accomplished than by other means. It may also prove beneficial to have increased light doses in areas of the BCP which may contain the PAGs or the other photoactive compounds in the BCP layer as opposed to other regions of the BCP.

In one exemplary non-limiting embodiment, the block copolymer resist could be coated with a functional topcoat. One non-limiting potential functional topcoat could be a contrast enhancement layer (CEL) or a reversible CEL (RCEL). A CEL or RCEL topcoat may allow for the printing of features smaller than possible without the contrast enhancement. As example, take the case of a positive tone cleavable block copolymer photoresist. Without a contrast enhancement layer, for good image transfer it is important that only the interfaces directly surrounding the phase-separated blocks to be removed be given a sufficient dose to encourage significant bond cleavage, otherwise blocks other than those desired may be at least partially removed during development. The image contrast enhancement layer could help to print smaller features by effectively cutting off the low intensity light at the edges of the light pattern before the light can impinge the resist.

In another preferred exemplary illustrative embodiment, the use of non-linear absorption processes to drive the cleavage of the block copolymer photoresist and also potentially the chemical changes to the fragments of the block copolymer photoresist may also increase the resolution of printable features. As non-limiting examples, the cleavage may be driven by a non-linear optical absorption process, where the reaction probability does not depend linearly on the intensity of the light, but superlinearly, or where the cleavage or deprotection of one of the blocks is driven by an acid or base catalyzed reaction, the generation of the acid may be driven in a non-linear fashion as well. Similar to the case of the BCP with a contrast enhancement layer, this would mean that low intensity light at the edges of the spatial distribution would not be sufficient to drive the reactions, in this case because of the superlinear dependence on intensity rather than for the case of the CEL where the low intensity light is absorbed before reaching the BCP.

The invention claimed is:

1. A method of making an integrated circuit comprising:
depositing a pinning layer on a substrate;
forming a block copolymer photoresist on the pinning layer;
wherein the formed block copolymer photoresist comprises first and second blocks A and B that do not self-assemble under at least some annealing conditions;
projecting a light pattern onto the block copolymer photoresist thereby exposing at least a selected region of the block copolymer photoresist and the pinning layer with actinic radiation, the actinic radiation inducing chemical changes in the pinning layer and the block copolymer;
the actinic radiation changing block A to a different block A' in the block copolymer;
annealing the wafer under said at least some annealing conditions such that A' and B self-assemble to thereby form regions of A' in contact with the exposed region of the pinning layer;
developing the block copolymer photoresist; and
further processing said substrate to make an integrated circuit.

2. The method of claim 1 wherein said actinic radiation is 193 nm radiation.

3. The method of claim 1 wherein said actinic radiation is EUV radiation.

4. The method of claim 1 further including processing the exposed block copolymer photoresist to cleave at least some block copolymer bonds in the exposed selected region.

5. The method of claim 1 further including processing the exposed pinning layer to create a chemical epitaxial pattern to direct the local self assembly of the block copolymer.

6. An integrated circuit device made by a process including:
- depositing a pinning layer on a substrate;
- forming a block copolymer photoresist on the pinning layer;
- wherein the block copolymer comprises first and second blocks A and B that do not self-assemble under at least some annealing conditions;
- projecting a light pattern onto the block copolymer photoresist thereby exposing at least a selected region of the block copolymer photoresist and the pinning layer with actinic radiation, the actinic radiation inducing chemical changes in the pinning layer and the block copolymer, the actinic radiation changing block A to a different block A' in the block copolymer;
- annealing the wafer under said at least some annealing conditions such that A' and B self-assemble to thereby form regions of A' in contact with the exposed region of the pinning layer;
- developing the block copolymer photoresist; and
- further processing said substrate to form integrated circuitry thereon.

7. The integrated circuit of claim 6 wherein said actinic radiation is 193 nm radiation.

8. The integrated circuit of claim 6 wherein said actinic radiation is EUV radiation.

9. The integrated circuit of claim 6 wherein the process further includes processing the exposed block copolymer photoresist to cleave at least some block copolymer bonds in the exposed selected region.

10. The integrated circuit of claim 6 wherein the process further includes processing the exposed pinning layer to create a chemical epitaxial pattern to direct the local self assembly of the block copolymer.

11. A method of forming a pattern comprising:
- depositing a pinning layer on a substrate;
- forming a block copolymer photoresist on the pinning layer;
- wherein the formed block copolymer photoresist comprises first and second blocks A and B that do not self-assemble under at least some annealing conditions;
- projecting a light pattern onto the block copolymer photoresist thereby exposing at least a selected region of the block copolymer photoresist and the pinning layer with actinic radiation, the actinic radiation inducing chemical changes in the pinning layer and the block copolymer, the actinic radiation changing block A to a different block A' in the block copolymer;
- annealing the wafer under said at least some annealing conditions such that A' and B self-assemble to thereby form regions of A' in contact with the exposed region of the pinning layer; and
- developing the block copolymer photoresist.

12. The method of claim 11 further including processing the exposed block copolymer photoresist to cleave at least some block copolymer bonds in the exposed selected region.

13. The method of claim 11 further including processing the exposed pinning layer to create a chemical epitaxial pattern to direct the local self assembly of the block copolymer.

* * * * *